United States Patent [19]

Maruyama et al.

[11] Patent Number: 4,894,317
[45] Date of Patent: Jan. 16, 1990

[54] METHOD OF FORMING A PRINTED CIRCUIT AND THE PRINTED CIRCUIT FORMED THEREFROM

[75] Inventors: Tsutomu Maruyama; Tadaaki Satoh, both of Hiratsuka, Japan

[73] Assignee: Kansai Paint Co., Ltd., Amagasaki, Japan

[21] Appl. No.: 176,466

[22] Filed: Apr. 1, 1988

[30] Foreign Application Priority Data

Apr. 2, 1987 [JP] Japan .................... 62-82134

[51] Int. Cl.$^4$ .................... G03C 11/00; G03C 5/00
[52] U.S. Cl. .................... 430/319; 430/318; 430/330; 430/935; 430/198
[58] Field of Search ............... 430/313, 315, 318, 319, 430/329, 314, 198, 330, 935

[56] References Cited

U.S. PATENT DOCUMENTS 3,738,835 6/1973 Bakos .................... 430/286
4,069,055 1/1978 Crivello .................... 430/280
4,592,816 6/1986 Emmons et al. ................ 204/180.6
4,671,854 6/1987 Ishikawa et al. ................ 156/659.1
4,751,172 6/1988 Rodriquez et al. ................ 430/314

OTHER PUBLICATIONS

Research Disclosure 12007, "Electrostatic Powder Coating of Photocrosslinkable Polymers", Research Disc., Apr. 1974.

Primary Examiner—Jose G. Dees
Attorney, Agent, or Firm—Fisher, Christen & Sabol

[57] ABSTRACT

A method of forming a printed circuit by use of a specified photo-curable coating composition. The photo-curable coating composition is a photo-curable or ionizing radiation-curable powder coating composition containing a thermoplastic resin in a solid state at normal temperature, and having 0.5 to 5 of a polymerizable unsaturated group per 1000 of number average molecular weight, as a film-forming component.

3 Claims, No Drawings

METHOD OF FORMING A PRINTED CIRCUIT AND THE PRINTED CIRCUIT FORMED THEREFROM

BACKGROUND OF THE INVENTION (1) Field of the Invention:

This invention relates to a method of forming a printed circuit, more particularly to a method of forming a printed circuit by use of a specified photo-curable resin coating composition, and to the printed circuit formed therefrom.

(2) Description of the Prior Art:

The formation of the printed circuit has conventionally been carried out by a method which comprises coating a photo-curable resin coating composition on a copper foil plated insulative plate (hereinafter referred to as an insulative plate), subjecting the coated film to light exposure and development through a circuit pattern mask to form a resist film followed by melt plating or electric plating, and removing the resist film and the unnecessary part of the copper foil.

The step of forming the resist film in the aforementioned method is conventionally carried out by coating the photo-curable resin coating composition on the insulative plate with a spray coater, roll coater, curtain flow coater, or the like. However, the aforementioned step of forming the resist film has such problems that it is difficult for the photo-curable resin coating composition to be thoroughly coated on corners of through-holes when coated on the insulative plate having through-holes because the photo-curable resin coating composition is liquid at normal temperature, and that thick-coating causes defects in the film such as sag, run and the like, making it impossible to form the intended printed circuit. On the other hand, such a problem remains unsolved in that an unsaturated monomer is used in combination with the photo-curable resin to prepare the photo-curable resin coating composition in order to improve coating workability, curing characteristics and the like, and the smell and toxicity of the unsaturated monomer provide adverse effects on the coating operator from the standpoints of safety and hygiene.

In addition thereto, a process in which a coating composition by water-dispersing a photo-curable resin is subjected to electrodeposition coating, is known. However, since the electrodeposition coating composition used therein has a relatively low melting point and is prepared by dispersing a resin having a large amount of carboxyl groups in an aqueous medium containing a large amount of an alcoholic organic solvent, the film formed therefrom has poor electrical insulating properties due to such reasons that the film is thin, that volatilization of the alcoholic organic solvent is so slow that the solvent remains in the film for a long period of time, that the film contains a large amount of carboxyl groups, and so forth. Further, the aforementioned process has such a drawback that the treatment of the resulting film by electric plating, melt plating or the like in the following step causes deposition of metal on the film, resulting in making it difficult to remove the resist film with alkali or the like, and in making it impossible to form the intended printed circuit.

SUMMARY OF THE INVENTION

It is an object of the present invention to provide a method of forming a printed circuit, which is capable of forming a highly insulative resist film, resulting in making it easy to remove the resist film.

It is another object of the present invention to provide a method of forming a printed circuit, which is capable of forming such a thick and highly insulative resist film as to make it easy to remove the resist film when dipped into a molten solder bath providing deposition of metal in a large amount.

It is another object of the present invention to provide a method of forming a printed circuit, which is capable of forming a film having good edge-covering properties in corners of the insulative plate having through-holes when the coating composition is coated on the insulative plate and the resulting coated plate is heated and molten to form a non-cured resist film.

It is still another object of the present invention to provide a method of forming a printed circuit, which is safely operable from the standpoints of fire and hygiene.

It is still another object of the present invention to provide a printed circuit formed according to the aforementioned method of the present invention.

That is, the present invention provides a method of forming a printed circuit, which method comprises coating a photo-curable resin coating composition on a copper foil plated insulative plate, exposing the coated plate to light through a pattern mask, removing the non-exposed area of the coated plate followed by development to form a resist film, carrying out metal plating on the exposed copper foil, removing the resist film, and removing the resulting exposed copper foil, said photo-curable resin coating composition being a photo-curable or ionizing radiation-curable powder coating composition containing a thermoplastic resin in a solid state at normal temperature and having 0.5 to 5 of a polymerizable unsaturated group per 1000 of number average molecular weight, as a filmforming component.

The present invention also provides a printed circuit formed according to the aforementioned method of the present invention.

DETAILED DESCRIPTION OF THE INVENTION

The thermoplastic resin as the film-forming component of the powder coating composition used in the present invention may include those having various kinds of structures depending on the way in which the resin and the unsaturated group are introduced.

Examples of the thermoplastic resin include (1) vinyl or acrylic polymer having the polymerizable unsaturated group on the side chain; (2) polyester or polyether having the polymerizable unsaturated group on the side chain or terminal; (3) unsaturated polyester prepared by use of unsaturated polybasic acid as the major component of the polybasic acid; (4) unsaturated epoxy ester prepared from unsaturated acid and epoxy resin; (5) polyurethane prepared by using unsaturated acid or unsaturated alcohol as one component; (6) melamine resin prepared by introducing unsaturated group; (7) oil-modified alkyd resin and oil-modified aminoalkyd resin having polymerizable unsaturated group; and (8) silicone-modified resin having polymerizable unsaturated group.

It is necessary for the thermoplastic resin having the polymerizable unsaturated group and used in the present invention to have 0.5 to 5.0, preferably 0.5 to 3.5 of the polymerizable unsaturated group per 1000 of the number average molecular weight. When the number of the unsaturated group is 0.5 or less, the crosslinking reactivity is reduced and physical properties of the cured film become undesirably poor, and when the number of the unsaturated group is 5 or more, the cross-linking reactivity is satisfactory, but adhesion properties onto the substrate, and impact resistance and flexibility of the cured film become undesirably poor. The thermoplastic resin must be in the solid state at normal temperature and melt at a temperature in the range of from 50° to 200° C., preferably 60° to 120° C., wherein, if necessary, a plasticizer may be added to reduce the temperature at which the resulting resin melts. Advantageously, the thermoplastic resin has a glass transition temperature in the range of from 20° to 120° C., preferably 40° to 70° C.

The powder coating composition used in the present invention may be prepared by such a process that, if necessary, various additives such as photopolymerization initiator, flow adjuster and the like may be incorporated into the thermoplastic resin and the resulting formulation is subjected to thermal dispersion followed by cooling to be comminuted, or that the aforementioned formulation is dissolved in a low boiling organic solvent and is then comminuted by the conventional process such as spray drying. In this case, when the particle size is too large, close contact between particles becomes difficult, resulting in making it difficult to obtain a uniform coated film by heat fusion. Therefore, the particle diameter may vary depending on the coating process, but is preferably 150μ or less in the case of the electrostatic-fluidized bed coating, and is preferably 100μ or less in the case of the electrostatic coating.

The powder coating composition used in the present invention may include a powder electrodeposition coating composition to be mentioned hereinafter.

The powder coating composition thus obtained is coated by a coating method such as fluidized bed coating, electrostatic-fluidized bed coating, electrostatic coating, powder electrophoretic deposition coating or spray coating and is then heat-fused on the insulative plate at a treating temperature of 50° to 200° C., preferably 60° to 120° C., and is then cured by irradiation of ionizing radiation such as electron beam, X rays or the like, or of ultraviolet light through a circuit pattern mask, preferably while it is in a fused liquid state to obtain a resist film.

Crosslinking curing by irradiation of the ionizing radiation is carried out by irradiating the electron beam in an irradiation dose of 5 to 15 Mrad by use of an electron beam accelerator of an accelerating voltage of 0.1 to 2.0 MeV, while crosslinking curing by irradiation of ultraviolet light is carried out by incorporating a photopolymerization initiator into the powder thermoplastic resin composition.

The powder electrodeposition coating composition used in the present invention may include cationic or anionic powder electrodeposition coating composition prepared by water-dispersing the aforementioned powder coating composition of fine powder by use of a dispersing agent such as cationic or anionic resin which is capable of making polyamino resin or polycarboxylic acid resin having amino group or carboxyl group in the resin skeleton respectively water-dispersible or water-soluble by neutralizing with an acid or base, or by use of cationic or anionic surface active agent or the like. Examples of the cationic or anionic resin include copolymers of amino group-containing acrylic ester, amino group-added epoxy resin, copolymers of carboxyl group-containing acrylic ester, carboxyl group-containing polyester resin, and the like.

The aforementioned cationic or anionic resin used ma include those having photo-curable functional group therein.

The electrodeposition coating composition is subjected to electrodeposition coating under normal electrodeposition coating conditions so as to form a film having a thickness of 30 to 200μ as a dry film on the insulative plate to be washed with water followed by heating at a temperature of 50° to 200° C., preferably 60° to 120° C. to form a fused film on the insulative plate, and the fused film is cured by irradiating ionizing radiation or ultraviolet light through a circuit pattern mask to obtain a resist film.

The photopolymerization initiator may be added, as necessary, to the powder coating composition. Examples of the photopolymerization initiator include benzoin, benzoin methyl ether, benzoin ethyl ether, benzoin n-propyl ether, benzoin n-butyl ether, benzyl benzophenone, p-methylbenzophenone, diacetyl, eosin, Thionine, Michler's ketone, acetophenone, 2-chlorothioxanthone, anthraquinone, chloroanthraquinone, 2-methylanthraquinone, α-hydroxyisobutylphenone, p-isopropyl α-hydroxyisobutylphenone, α,α-dichloro-4-phenoxyacetophenone, 1-hydroxy-1-cyclohexylacetophenone, 2,2-dimethoxy-2-phenylacetophenone, methylbenzoyl formate, 2-methyl-1-14-(methylthio) phenyl-1-2-morpholinopropene, dichlorothioxanthone, diisopropyl thioxanthone, benzophenone, phenyl-disulfide-2-nitrofluorene, butyroin, anisoin ethyl ether, azobisisobutyronitrile, tetramethylthiuram disulfide, and the like. The photopolymerization initiator may be added thereto in an amount of about 0.1 to 10% by weight relative to the photo-curable resin.

Examples of the irradiation source of ultraviolet light in the practice of the method of the present invention include mercury vapor lamp, high pressure mercury vapor lamp, superhigh pressure mercury vapor lamp, xenon arc lamp, carbon arc lamp, metal halide lamp, the sunlight, and the like. The ultraviolet light is irradiated preferably in an atmosphere of air or inert gas. When irradiated in an atmosphere of air, it is particularly preferable to use high pressure mercury vapor lamp as the irradiation source.

Examples of the electron beam accelerator used in the case of carrying out electron beam irradiation are of cockcroft type, cockcroft-walton type, resonance transformer type, transformer type, insulated core transformer type, dynamitron type, linear filament type, broad beam type, area beam type, cathode ionization type, high frequency type, and the like. The irradiation dose of the electron beam is not specifically limited so long as the electron beam is irradiated in a dose necessary to cure the film, but generally the electron beam is irradiated in a dose of about 0.5 to 20 Mrad at about 100 to 2000 keV. The electron beam is irradiated preferably in an atmosphere of an inert gas.

In the method of forming a printed circuit of the present invention, the non-exposed area of the resist film formed on the insulative plate as above mentioned is removed by developing treatment. The developing treatment may be carried out without special limitations so long as the non-exposed area only is removed. Examples of the developing treatment method of removing the non-exposed area only of the powder coating composition include a method of washing with an organic solvent capable of dissolving the thermoplastic powder resin to remove the same, and a method of neutralizing the cationic resin or anionic resin as the dispersing agent of the thermoplastic powder resin with a neutralizing agent followed by washing with water, in the case of the cationic powder electrodeposition coating composition or anionic powder electrodeposition coating composition. Examples of the organic solvent include aromatic hydrocarbons such as toluene, xylene and the like; esters such as ethyl acetate, butyl acetate and the like; ketones such as methyl ethyl ketone, methyl isobutyl ketone and the like; ethers such as methyl cellosolve, ethyl cellosolve and the like; and the like. Examples of the neutralizing agent include a dilute aqueous solution of a base such as caustic soda, sodium carbonate, caustic potash, ammonia or the like, or a dilute aqueous solution of an acid such as formic acid, acetic acid, hydroxyacetic acid, hydrochloric acid, sulfuric acid or the like.

A metal such as gold, solder or the like is deposited on the copper foil exposed on the insulative plate by development according to the conventional process such as melt plating, electric plating, or the like. Thereafter, the resist film on the circuit pattern is removed with the aqueous solution of the acid or base, or with the organic solvent such as trichloroethylene, perchloroethylene, dioxane or the like. Further the copper foil exposed by removal of the resist film is subjected to an etching treatment with an aqueous solution of cupric chloride, ferric chloride or the like to form a printed circuit.

Moreover, the printed circuit plate formed according to the aforementioned method may be coated with the powder coating composition used in the present invention to be heated and molten followed by light exposure and development to form a solder resist film and by melt plating to form a new circuit.

The use of the powder coating composition as characteristics of the method of the present invention makes it possible to form a highly insulative resist film because said powder coating composition contains a functional group such as carboxyl group showing high electrical conductivity or the like in an amount less than in the conventional coating composition in the art, so that the powder coating composition has such excellent properties that in the case where the electric plating is carried out on the resist film having the aforementioned advantages, the resist film may be easily removed by use of chemicals or organic solvent without deposition of metal on the surface of the film due to the electric plating. Further the use of the coating composition of the present invention makes it possible to form a thick, highly insulative resist film on the insulative plate by powder coating or electrodeposition coating, and dipping of the resulting film into a molten solder bath providing deposition of metal in a large amount causes no deposition of metal on the film, resulting in making it easy to remove the resist film too. Further on heat-fusing the coated plate obtained by coating the coating composition on the insulative plate to form an uncured resist film, the coated plate is generally heated at a low temperature to form a film, resulting in forming a film with high melt viscosity and having good edge-covering properties in corners of the insulated plate having through-holes. Further the method of the present invention is safely operable from the standpoints of fire and hygiene because the coating composition contains no monomer components.

The present invention will be explained more in detail by the following Examples. The "part" or "%" in Examples is based on weight.

PREPARATION EXAMPLE 1

To a flask equipped with a stirrer, a thermometer and a condenser are charged 3 moles of tolylene diisocyanate (2,4—/2,6—=80/20) and 3 moles of 2-hydroxyethyl acrylate to be reacted with agitation at 60° C. for 2 hours, followed by adding one mole of methylol propane and by reacting at 80° C. for 3 hours to obtain a thermoplastic resin having polymerizable unsaturated group. The resulting resin contains 2.9 of the unsaturated group per 1000 of the molecular weight.

The resulting resin is comminuted in an atomizer and put through a 150-mesh screen to obtain a resin composition I having an average particle size of 40 to 50$\mu$. The resulting resin has a glass transition temperature of about 60° C.

PREPARATION EXAMPLE 2

To a flask equipped with a stirrer, a thermometer, a condenser and a nitrogen inlet tube are charged 3.8 moles of isophthalic acid, 1.2 moles of adipic acid, 4.0 moles of neopentylglycol and 50 cc of xylene to be heated at 200° to 210° C. introducing nitrogen, while xylene is refluxed to distill off water by azeotropic distillation. To 100 parts of the polyester (acid value: 139) thus obtained are added 25 parts of glycidyl methacrylate, 0.5 part of tetraethyl ammonium bromide and 0.06 part of hydroquinone to be reacted at 100° C. for 3 hours, followed by removing xylene under a reduced pressure to obtain a thermoplastic resin having a polymerizable unsaturated group. The resulting resin has a molecular weight of 1450 and contains 1.4 of unsaturated group per 1000 of the molecular weight.

The resin thus obtained is comminuted in an atomizer and put through a 200-mesh screen to obtain a powder resin composition II having an average particle size of 30 to 40$\mu$. This resin gas a glass transition temperature of about 70° C.

PREPARATION EXAMPLE 3

To a flask equipped with a stirrer, a thermometer, a condenser and a nitrogen inlet tube are charged 55 parts of styrene, 30 parts of ethyl acrylate, 15 parts of glycidyl methacrylate, 2 parts of azobisisobutyronitrile and 100 parts of xylol to be heated at 100° to 110° C. under nitrogen stream and to complete polymerization. Thereafter 8 parts of acrylic acid, 0.4 part of tetramethylammonium oxide and 0.05 part of hydroquinone are added thereto to be reacted at 100° C. for 3 hours, followed by removing xylene under reduced pressure to obtain a thermoplastic resin having a polymerizable unsaturated group. This resin has a molecular weight of about 10000 and contains 0.9 of the unsaturated group per 1000 of the molecular weight.

The resin thus obtained is comminuted in an atomizer and put through a 200-mesh screen to obtain a powder resin having an average particle size of 25 to 35$\mu$. This resin has a glass transition temperature or about 50° C.

EXAMPLE 1

The powder resin composition I is coated on a copper plated laminated, insulative plate according to the electrostatic-fluidized bed coating process and heated at 90° C. for 15 minute to obtain a resist coated, laminated plate having an average film thickness of 100$\mu$. This resist coated, laminated plate is exposed to ultraviolet light in an irradiation dose of 75 mj/cm$^2$ through a photographic pattern mask according to photography, and the non-exposed area is removed with a mixed solvent of butyl acetate:butanol=1:1 to carry out development and to prepare a circuit. The resulting circuit plate is subjected to plating in a solder plating bath under 5 A/dm$^2$ for 20 minutes.

No phenomenon of deposition of plating particles on the resist film is observed, and the resist film has good electrical insulating properties.

After carrying out plating, the resist film is removed with 3% sodium hydroxide solution at a temperature of 50° C. followed by removing the foil by use of an aqueous cupric chloride solution to obtain an intended printed circuit plate.

EXAMPLE 2

The powder resin composition II is coated on a copper plated laminated plate according to the electrostatic-fluidized bed coating process and heated at 100° C. for 10 minutes to obtain a resist coated, laminate plate having an average film thickness of 80μ. Thereafter the resist coated, laminated plate is exposed to ultraviolet light in an irradiation dose of 75 mj/cm$^2$ through a photographic pattern mask according to the photography, and the non-exposed area is then removed with a mixed solvent of butyl acetate:butanol=1:1 to carry out development and to prepare a circuit. The circuit plate thus obtained is subjected to plating in a gold bath under 5 A/dm$^2$ for 20 minutes.

No phenomenon of deposition of plating particles on the resist film is observed, and the resist film has good electrical insulating properties.

After carrying out plating, the resist film is removed with 3% sodium hydroxide solution at a temperature of 50° C. followed by removing the exposed copper foil by use of an aqueous cupric chloride solution to obtain an intended printed circuit plate.

EXAMPLE 3

To 286 parts of anionic electrodeposition coating composition (Sonne EDUV No. 338, marketed by Kansai Paint Co., Ltd.) neutralized with triethylamine by 0.4 equivalence and adjusted to 35% solids is added 340 parts of the powder resin composition III to be mixed and dispersed in a pebble mill for 24 hours followed by diluting with deionized water to 15% solids, wherein the triethylamine is added thereto so as to adjust pH to 6.9 to 7.2 at a bath temperature of 30° C.

The dispersion thus obtained is introduced into an electrodeposition bath. A copper plated laminated plate having through-holes is connected with an anode and a stainless steel plate is connected with a cathode to deposit an electrodeposition film under the electrodeposition conditions of an applied voltage of 120 V, an electrodeposition time of 3 minutes and a bath temperature of 25° C., followed by washing with water and by heating at 80° C. for 20 minutes to obtain a resist film having a thickness of 60°. This film has good edgecovering properties for through-holes. Next, a printed circuit plate is prepared in the same manner as in Example except that the developing treatment is carried out by use of an aqueous solution of 1% sodium carbonate in place of the mixed solvent of butyl acetate:butanol=1:1 in the method of forming the printed circuit. The printed circuit thus obtained has good electrical insulating properties without deposition of the plating particles on the resist film.

EXAMPLE 4

The printed circuit plate subjected to etching followed by removal of the etching resist) formed according to Example 1 is heated to 100° C. to be coated with the powder resin composition I according to the electrostatic-fludized bed coating process to a thickness of 130μ.

The resist coated circuit plate is exposed to light according to the photography and subjected to development followed by dipping in a molten solder bath for 6 seconds to obtain a circuit plate, the resulting film has good solder resist properties.

What is claimed is:

1. A method of forming a printed circuit, comprising the steps of:
    coating a photo-curable resin coating composition, comprising a photo-curable or ionizing radiation-curable powder coating composition containing a thermoplastic resin selected from a group consisting of (1) vinyl or acrylic polymer having polymerizable unsaturated group on the side chain; (2) polyester or polyether having polymerizable unsaturated group on the side chain or terminal; (3) unsaturated polyester prepared by use of polybasic acid; (4) unsaturated epoxy ester prepared from unsaturated acid and epoxy resin; (5) polyurethane prepared by using unsaturated acid or unsaturated alcohol as one component; (6) melamine resin prepared by introducing unsaturated group; (7) oil-modified alkyd resin and oil-modified aminoalkyd resin having polymerizable unsaturated group; and (8) silicone-modified resin having polymerizable unsaturated group, onto a copper foil plated insulative plate, said thermoplastic resin being in a solid state at normal temperature and having 0.5 to 5 of a polymerizable unsaturated group per 1000 of number average molecular weight, as a film-forming component;
    heat-fusing the powder coating composition coated on the insulative plate to a fused liquid state;
    exposing the coated plate to light through a pattern mask;
    removing a non-exposed area of the coated plate followed by developing an exposed area to form a resist film;
    metal plating exposed copper foil;
    removing the resist film; and
    removing the resulting exposed copper foil.

2. A method of forming a printed circuit as claimed in claim 1, wherein said powder coating composition is a powder electrodeposition coating composition.

3. A method of forming a printed circuit as claimed in claim 2, wherein said powder electrodeposition coating composition is a cationic or anionic powder electrodeposition coating composition water-dispersed by use of a dispersing agent.

* * * * *